United States Patent [19]

Yamazaki et al.

[11] Patent Number: 4,907,064

[45] Date of Patent: Mar. 6, 1990

[54] SEMICONDUCTOR DEVICE HAVING SILICON OXYNITRIDE FILM WITH IMPROVED MOISTURE RESISTANCE

[75] Inventors: Kouji Yamazaki; Hideki Gomi, both of Tokyo, Japan

[73] Assignee: NEC Corporation, Tokyo, Japan

[21] Appl. No.: 93,657

[22] Filed: Sep. 8, 1987

[30] Foreign Application Priority Data

Sep. 8, 1986 [JP] Japan .................... 61-212358

[51] Int. Cl.$^4$ ............................ H01L 29/34
[52] U.S. Cl. ........................... 357/54; 357/52; 357/73
[58] Field of Search .............. 357/54, 52, 71, 72, 357/73

[56] References Cited

U.S. PATENT DOCUMENTS

| | | | |
|---|---|---|---|
| 3,629,088 | 12/1971 | Frank et al. | 357/54 X |
| 4,091,406 | 5/1978 | Lewis | 357/54 |
| 4,097,889 | 6/1978 | Kern et al. | 357/54 |
| 4,581,622 | 4/1986 | Takasaki et al. | 357/52 X |
| 4,621,277 | 11/1986 | Ito et al. | 357/54 |

*Primary Examiner*—Andrew J. James
*Assistant Examiner*—Sara W. Crane
*Attorney, Agent, or Firm*—Sughrue, Mion, Zinn, Macpeak & Seas

[57] ABSTRACT

Disclosed herein is a semiconductor device having an aluminum wiring formed on a semiconductor substrate and a silicon oxynitride film covering the aluminum wiring and having Si, N, O as main elements, atomic ratio of the three elements being expressed by $Si_xN_yO_z$ (where $x+y+z=1.00$), a range of the atomic ratio lying on lines interconnecting the following eight points in a Si-N-O ternary system or lying inside a region bounded by these lines;

($x=0.51$, $y=0.28$, $z=0.21$)

($x=0.47$, $y=0.28$, $z=0.25$)

($x=0.44$, $y=0.31$, $z=0.25$)

($x=0.41$, $y=0.36$, $z=0.23$)

($x=0.41$, $y=0.39$, $z=0.20$)

($x=0.44$, $y=0.38$, $z=0.18$)

($x=0.46$, $y=0.37$, $z=0.17$)

($x=0.51$, $y=0.32$, $z=0.17$).

Preferably, this silicon oxynitride film contains H of 5 to 18 atomic percents.

1 Claim, 7 Drawing Sheets

SEMICONDUCTOR DEVICE HAVING SILICON OXYNITRIDE FILM WITH IMPROVED MOISTURE RESISTANCE

BACKGROUND OF THE INVENTION

1. Field of the Invention

The present invention relates to a silicon oxynitride film used in a semiconductor device and more particularly, to an improvement in the silicon oxynitride film to have high moisture resistance.

2. Description of the Related Art

A silicon nitride film has been used widely in a semiconductor device as a passivating overcoat film and as an inter-layer insulation film for a multi-layered wiring.

However, voids are created in the aluminum wiring due to a large stress of the silicon nitride film when the aluminum wiring on a silicon (Si) substrate is covered with the silicon nitride film and subjected to heat-treatment above 450° C., as reported by J. T. Yue et al in "Stress Induced Voids in Aluminum Interconnects during IC Processing", 23rd annual proceedings reliability physics 1985 pp. 126~137. When the width of the aluminum wiring layer is sufficiently large, voids do not completely cut away the aluminum wiring layer. However, the problem becomes serious if the width is reduced to 2 μm or less. In that case, the aluminum wiring may be cut away by the voids.

It has been proposed to use a silicon oxynitride film instead of the silicon nitride film to mitigate the stress, in "Silicon Oxynitride Films from the NO-NH$_3$-SiH$_4$ Reaction", Journal of Electrochemical Soc., Vol. 120, No. 3, 1973, pp. 446~453. The composition of the silicon oxynitride film disclosed in this article is a compound of SiO$_2$ and Si$_3$N$_4$, that is, (SiO$_2$)$_x$(Si$_3$N$_4$)$_{1-x}$ (where $0<x<1$).

The present inventors have found, however, that the proposed composition of the silicon oxynitride film is disadvantageous in having a lower moisture resistance than that of a Si$_3$N$_4$ film. The (SiO$_2$)$_x$(Si$_3$N$_4$)$_{1-x}$ film cannot be used as a passivation overcoat film and an inter-layer insulation film for a semiconductor device. The U.S. Pat. No. 4,097,889 discloses the use of the silicon oxynitride film as the passivation film of semiconductor devices, stating about the composition of the silicon oxynitride film, however, only that a chemical compound has the formula Si$_w$N$_x$H$_y$O$_z$ wherein w, x, y and z are integers other than zero. It does not teach the composition of silicon oxynitride which does not create the voids in the aluminum wiring and has high moisture resistance.

SUMMARY OF THE INVENTION

It is, therefore, an object of the present invention to provide a semiconductor device having a silicon oxynitride film which has high moisture resistance and does not create any voids in a metal wiring layer.

The semiconductor device in accordance with the present invention includes a metal wiring layer formed on a semiconductor substrate and a silicon oxynitride film covering the metal wiring layer and essentially consisting of the composition which is represented by the formula Si$_x$N$_y$O$_z$ (where x, y and z represent a set of atomic ratios and $x+y+z=1.00$) and which falls within the range decided by the following combination of atomic ratios x, y and z in the Si-N-O ternary system:

(x=0.51, y=0.28, z=0.21)

(x=0.47, y=0.28, z=0.25)

(x=0.44, y=0.31, z=0.25)

(x=0.41, y=0.36, z=0.23)

(x=0.41, y=0.39, z=0.20)

(x=0.44, y=0.38, z=0.18)

(x=0.46, y=0.37, z=0.17)

(x=0.51, y=0.32, z=0.17)

Silicon oxynitride of the above-mentioned comprisition may be grown by a plasma-enhanced chemical vapor deposition method using SiH$_4$, NH$_3$ and N$_2$O as starting gases, with partial pressures of SiH$_4$, NH$_3$ and N$_2$O being varied to change the composition of silicon oxynitride. The silicon oxynitride film grown in this manner contains, in addition to the above-mentioned composition, hydrogen. The content of hydrogen is favorably 5 to 18 atomic % based on the silicon oxynitride film containing hydrogen.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

First Embodiment

Figure 1:
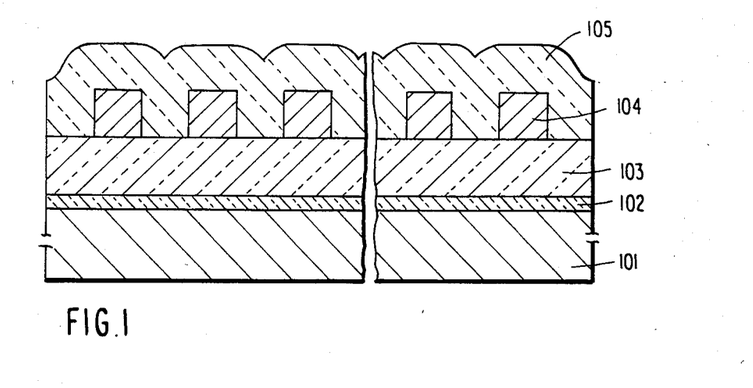
FIG. 1 is a sectional view of a semiconductor device according to a first embodiment of the present invention.

Referring to FIG. 1, a silicon wafer 101 having a diameter of 4 inches was thermally oxidized to form a silicon dioxide film 102 of 6,000 Å in thickness. Next, a phosphosilicate glass (PSG) film of 1 μm in thickness was deposited by chemical vapor deposition (CVD), and an aluminum film of 1 μm in thickness was further deposited by sputtering method. Aluminum stripes 104 each having a width of 2 μm were then formed by photolithography.

The thus formed silicon wafer having the aluminum stripes 104 on its surface and a silicon wafer having nothing on its surface (not shown) were introduced into a processing chamber of a parallel plate type plasma chemical vapor deposition. Next, $SiH_4$, $NH_3$ and $N_2O$ were introduced as starting gases into the chamber and the total pressure inside the chamber was kept at 0.3 Torr. The temperature of the silicon wafers were kept at 300° C. and discharge power of 0.5 W/cm² was applied to the parallel plate type electrodes to deposite silicon oxynitride films of 1 μm in thickness on these silicon wafers.

The compositions of the silicon oxynitride films were rechanged by changing the flow rates of the starting gases and silicon oxynitride films of thirty different compositions were formed. The flow rates of the starting gases used to form the first thirteen samples Nos. 1 to 13 are shown in Table 1 below.

TABLE 1

| Sample No. | Gas flow rates (cc/min) | | |
|---|---|---|---|
| | $SiH_4$ | $NH_3$ | $N_2O$ |
| 1 | 200 | 90 | 300 |
| 2 | 200 | 90 | 400 |
| 3 | 200 | 100 | 400 |
| 4 | 200 | 120 | 400 |
| 5 | 200 | 110 | 300 |
| 6 | 200 | 120 | 300 |
| 7 | 200 | 120 | 250 |
| 8 | 200 | 150 | 300 |
| 9 | 200 | 120 | 200 |
| 10 | 200 | 150 | 250 |
| 11 | 200 | 170 | 250 |
| 12 | 200 | 180 | 250 |
| 13 | 200 | 200 | 250 |

Next, the composition of each silicon oxynitride film thus formed was measured. Five samples each of which was 1 cm square were cut out from the 4-inch silicon wafer having the silicon oxynitride film deposited directly thereon, and the atomic ratios of Si, N and O and the content of H for each sample were obtained by the following method. The mean values of these five samples were then obtained to determine the composition of the silicon oxynitride.

The numbers of atoms of each of the elements Si, N, O and H in a unit value (1 cm³) of the silicon oxynitride were represented by a, b, c and d, respectively. The ratio of the number of atoms of Si to O: $k_1(=a/c)$ and that of N to O: $k_2(=b/c)$ were obtained by Rutherford Backscattering Spectroscopy (RBS), and the number of atoms of hydrogen d was obtained by Nuclear Reaction Analysis (NRS). Furthermore, the density D (g/cm³) of the silicon oxynitride film was measured and the numbers of atoms of Si, N and O in the unit value were calculated in accordance with the following equations;

$$a = \frac{(D - M_Hd)k_1}{K_1M_{Si} + k_2M_N + M_o}$$

$$b = \frac{(D - M_Hd)k_2}{k_1M_{Si} + k_2M_N + M_o}$$

$$c = \frac{D - M_Hd}{k_1M_{Si} + k_2M_N + M_o}$$

where, $M_{Si}$, $M_N$ and $M_o$ represent the atomic weight of Si, N and O, respectively.

When the silicon oxynitride film is expressed by $Si_xO_yN_z$, the atomic ratios x, y and z (atomic %) are obtained from the values a, b and c in accordance with the following equations:

$$x = \frac{a}{a + b + c} \times 100$$

$$y = \frac{c}{a + b + c} \times 100$$

$$z = \frac{b}{a + b + c} \times 100$$

Furthermore, the H content w (atomic %) with respect the silicon oxynitride film in total is obtained from the following equation:

$$w = \frac{d}{a + b + c + d}$$

In order to obtain $k_1$ and $k_2$ by RBS method, each sample was irradiated by He ions of 2.275 MeV and the scattered ions were subjected to energy analysis at a scattering angle of 165°, and were measured the heights $h_{Si}$, $h_N$ and $h_O$ of the each edge of Si, N and O. The values $k_1$ and $k_2$ were then obtained from the ratios of $h_{Si}$ to $h_O$ ($h_{Si}/h_O$) and $h_N$ to $h_O$ ($h_N/h_O$), respectively.

In order to obtain the number of H atoms d by NRA method, each sample was irradiated by $^{15}N^{2+}$ ions and the intensity of γ-rays obtained by the nuclear reaction was measured. The atomic density of H was then obtained by use of a polystyrene film, the density of H atoms of which was known, as a reference sample. The energy of $^{15}N^{2+}$ ions was changed from 6.38 MeV to 7.96 MeV at a rate of 0.08 MeV and measurements were made at twenty spots in the direction of depth of the silicon oxynitride film. The values at these spots were averaged to obtain d: the number of H atoms per cm³.

The density of the silicon oxynitride film was obtained by measuring the weight of the sample, which had the silicon oxynitride film deposited on the Si substrate, by a microgram meter, then removing the silicon oxynitride film to measure the weight of the Si substrate alone and dividing the difference of these weight by the volume of the silicon oxynitride film.

Figure 2:
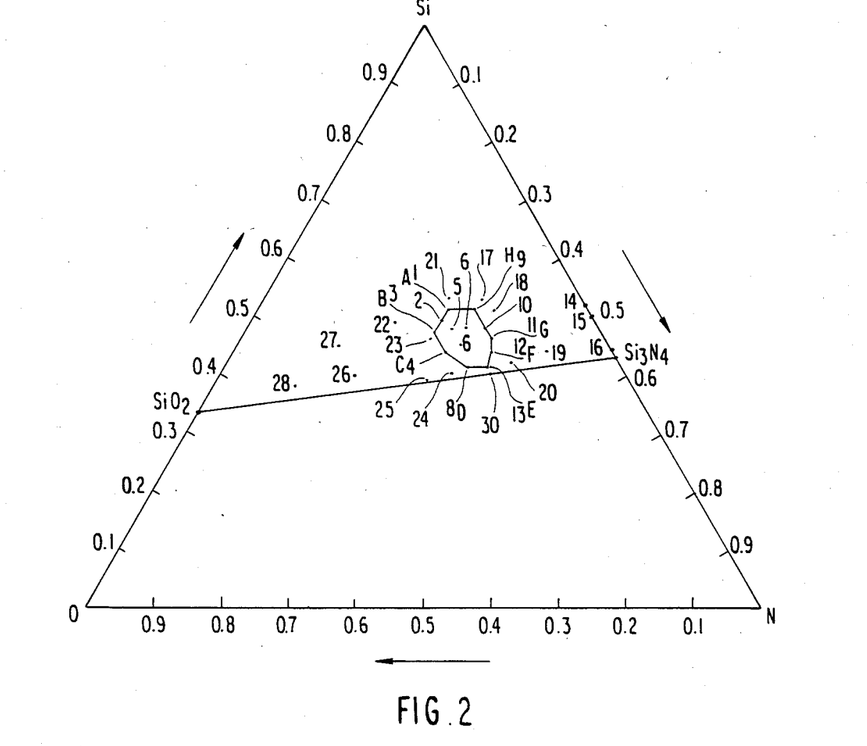
FIG. 2 is a triangular compositional diagram of a Si-N-O ternary system showing the effective range of the compositions of the present invention and the specific compositions of the examples.

Table 2 and FIG. 2 show the thus obtained compositions of the silicon oxynitride films of the samples Nos. 1 to 30.

TABLE 2

| Sample No. | Composition ratio (atomic %) | | | H content (atomic %) | Ratio of approved samples of PCT test (%) |
| --- | --- | --- | --- | --- | --- |
| | Si | N | O | | |
| 1 | 51 | 28 | 21 | 7 | 100 |
| 2 | 49 | 28 | 23 | 5 | 98 |
| 3 | 47 | 28 | 25 | 7 | 100 |
| 4 | 44 | 31 | 25 | 7 | 100 |
| 5 | 48 | 30 | 22 | 7 | 100 |
| 6 | 45 | 33 | 22 | 11 | 100 |
| 7 | 48 | 32 | 20 | 13 | 98 |
| 8 | 41 | 36 | 23 | 13 | 100 |
| 9 | 51 | 32 | 17 | 12 | 100 |
| 10 | 48 | 35 | 17 | 8 | 100 |
| 11 | 46 | 37 | 17 | 10 | 100 |
| 12 | 44 | 38 | 18 | 12 | 98 |
| 13 | 41 | 39 | 20 | 15 | 100 |
| 14 | 52 | 48 | 0 | 25 | 75 |
| 15 | 50 | 50 | 0 | 19 | 80 |
| 16 | 44 | 56 | 0 | 21 | 80 |
| 17 | 53 | 32 | 15 | 12 | 75 |
| 18 | 51 | 35 | 14 | 12 | 68 |
| 19 | 44 | 46 | 10 | 10 | 70 |
| 20 | 42 | 42 | 16 | 15 | 65 |
| 21 | 53 | 27 | 20 | 15 | 70 |
| 22 | 49 | 21 | 30 | 5 | 50 |
| 23 | 46 | 28 | 26 | 13 | 50 |
| 24 | 40 | 34 | 26 | 13 | 55 |
| 25 | 39 | 31 | 30 | 10 | 45 |
| 26 | 40 | 20 | 40 | 7 | 35 |
| 27 | 45 | 15 | 40 | 7 | 30 |
| 28 | 38 | 12 | 50 | 5 | 20 |
| 29 | 33 | 0 | 67 | 5 | 0 |
| 30 | 40 | 40 | 20 | 10 | 75 |

Then, a plurality of chips which were 3 mm by 3.5 mm were cut out from the silicon wafer having on its surface the aluminum strips and the silicon oxynitride film formed on the aluminum stripes.

One-hundred chip samples were selected from a plurality of chips of each sample number and heat-treated at 500° C. for one hour. Then, each sample was dipped into a phosphoric acid solution at 60° C. for 30 minutes. After such treatments, each chip was examined by an optical microscope to find cracks in the silicon oxynitride film. Large cracks can be observed directly by the microscope, while micro-cracks can be judged by observing the corrosion of the aluminum stripes by the phosphoric acid solution which penetrated through the micro-cracks.

When any cracks was not found out in all 100 chip samples of a same sample number, the sample of the sample number was rated as an approved sample. When all the samples Nos. 1 to 30 are evaluated in this manner, no crack was obserbed from the samples of any sample number.

One-hundred chip samples were selected from a plurality of chips of each sample number and heat-treated in an $N_2$ 50%—$H_2$ 50% atmosphere at 400° C. for one hour and the occurrence of any voids of the aluminum stripes was examined by the optical microscope. Voids were found in the samples Nos. 14, 15 and 16, but any void was not found in the samples of the other sample numbers.

One-hundred chip samples were selected from a plurality of chips of each samples number and subjected to a pressure cooker test (PCT) for 200 hours at 125° C., 2.3 atms and 100% relative humidity (RH), and cutting of the aluminum stripes was then examined electrically. Those samples free from cutting of the stripes were classified as approved samples and the yield of approved samples was calculated. The result is also shown in Table 2.

Furthermore, samples maintaining the same ratio of Si, O and N as the samples of sample Nos. 1 to 13 in Table 2 and having different hydrogen contents were manufactured by adding hydrogen to source gases, and the same evaluation was made for the samples. The occurrence of voids and cracks was not found, if hydrogen is contained, within the range of 5 to 18 atomic % of the H content, and the yield of approved samples was almost 100% in the pressure cooker test.

In the silicon oxynitride film of the present invention, the excellent properties as mentioned above are available only when the compositions represented by $Si_x O_y N_z$, when x, y and z represent a set of atomic ratios and $x+y+z=1.00$, fall within the area A-B-C-D-E-F-G-H of FIG. 2 or on the lines connecting the vertices of the area. The sets of atomic ratios of the vertices of the area are as follows:

| | x | y | z |
| --- | --- | --- | --- |
| A | 0.51 | 0.28 | 0.21 |
| B | 0.47 | 0.28 | 0.25 |
| C | 0.44 | 0.31 | 0.25 |
| D | 0.41 | 0.36 | 0.23 |
| E | 0.41 | 0.39 | 0.20 |
| F | 0.44 | 0.38 | 0.18 |
| G | 0.46 | 0.37 | 0.17 |
| H | 0.51 | 0.32 | 0.17 |

The silicon oxynitride film of the present invention may contain hydrogen, and in that case, the content of hydrogen is 5 to 18 atomic % of the $Si_x O_y N_z$ plus hydrogen.

Next, embodiments wherein the silicon oxynitride according to the present invention is applied to a passivation film or an inter-layer insulation film of a semiconductor device will be described.

Second Embodiment

Figure 3:
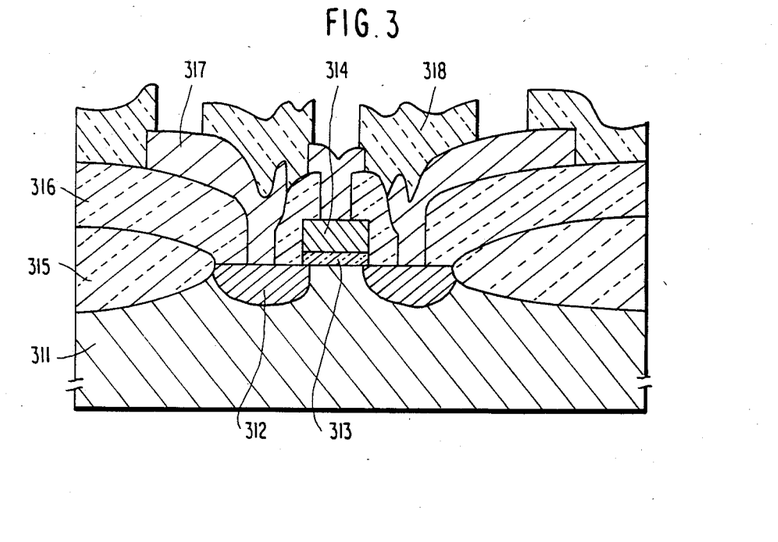
FIG. 3 is a sectional view of a semiconductor device according to a second embodiment of the present invention.

FIG. 3 is a sectional view of an N-channel silicon gate MOSFET using the silicon oxynitride film of the present invention as a final passivating insulator film.

In FIG. 3, reference numeral 311 represents a P-type (100) Si substrate having specific resistance of 10 ohm-cm, 312 is an N-type source or drain, 313 is a gate silicon dioxide film of 400 Å in thickness, 314 is a gate electrode consisting of polycrystalline silicon and having a thickness of 4,000 Å and layer resistance of 20 Ω/□, 315 is a silicon dioxide film of 4,000 Å in thickness for device isolation, 316 is a CVD-grown silicon dioxide film of 5,000 Å in thickness, 317 is an aluminum wiring of 0.5 μm in thickness and having a line width of 2 μm and 318 is a silicon oxynitride film of 0.5 μm in thickness formed by plasma chemical vapor deposition, having the atomic ratio of Si:N:O=44:31:25 and containing H of 7 atomic percent to the whole composition.

In the semiconductor device having the construction described above, since the silicon oxynitride film 318 of low stress is formed, cracks are not generated, and even after heat-treatment for one hour at 450° C. in $N_2$ 50%—$N_2$ 50% atmosphere, voids are not created in the aluminum wiring 317 and the reliability will thus be improved.

In regard to moisture resistance of the semiconductor device, the defective rate is examined by placing resin-molded semiconductor devices in a high temperature and high moisture atmosphere (125° C., 2.3 atms, 100%

Figure 4:
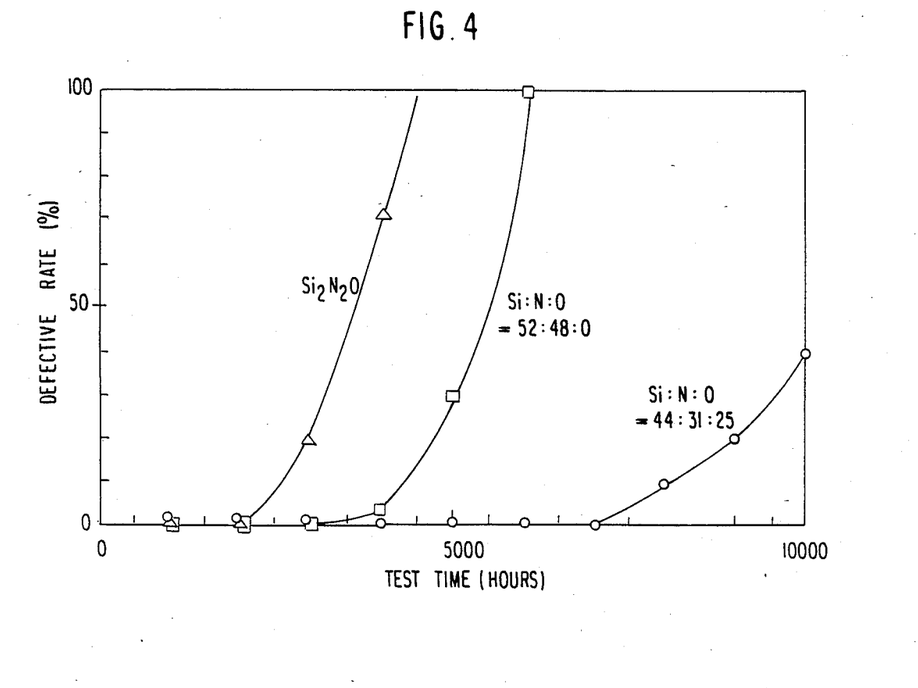
FIG. 4 is a diagram showing the relationship between a defective ratio of the semiconductor device according to the second embodiment of the present invention at a high temperature and high humidity atmosphere and a test time.

RH). When a threshold voltage of the MOS transistor changes more than 10%, it is determined that the sample becomes inferior. The results of the moisture resistance test are shown in FIG. 4. As shown in this diagram, within the test time of 10,000 hours, the defective rate of the semiconductor device using the silicon oxynitride film 318 as the final passivation film is lower than that of the semiconductor devices which use a silicon nitride film or a $Si_2N_2O$ film which is a 1:1 compound of $SiO_2$ and $Si_3N_4$. Therefore, when the silicon oxynitride film 318 is used as the final passivation film, the semiconductor device comes to possess high moisture resistance and high reliability.

Next, a manufacturing method of the semiconductor device according to the second embodiment of the present invention will be described.

FIGS. 5(a) to 5(d) are sectional views for explaining principal steps of manufacturing method for the semiconductor device according to the second embodiment of the present invention.

Figure 5A:
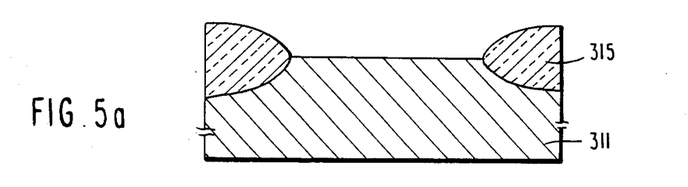
FIGS. 5(a) to 5(d) are sectional views showing principal steps for manufacturing the semiconductor device according to the second embodiment of the present invention.

First of all, the oxide film 315 for device isolation is formed on the P-type Si substrate 311 by selective oxidation as shown in FIG. 5(a).

Figure 5B:
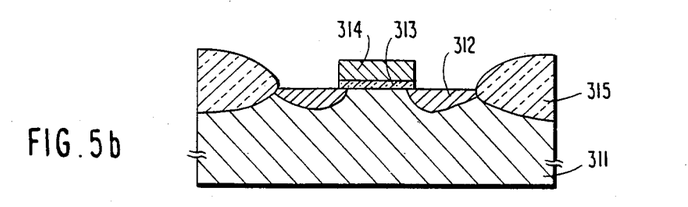

Next, a gate silicon dioxide film 313 of 400 Å in thickness is formed in an active region where the oxide film 315 for device isolation is not formed and a polycrystalline silicon 314 of 4,000 Å in thickness is formed as a gate electrode on the gate silicon dioxide film 313 by CVD using $SiH_4$ as a source gas at 600° C., as shown in FIG. 5(b). Phosphorus (P) is doped into this polycrystalline silicon 314 to a resistance value of 20 $\Omega/\square$ by thermal diffusion at 920° C. for one hour using $POCl_3$ and the gate electrode is patterned by reactive ion etching using $CF_4$ gas. Next, a source or drain 312 is formed by implanting As ions into the P-type Si substrate 311 at energy of 70 KeV and in a dose of $5 \times 10^{15}$ cm$^{-2}$ by self-alignment method using polycrystalline silicon 314 as a mask. Heat-treatment is further made at 900° C. for one hour so as to set the sheet resistance value of the source or drain 312 to 100 $\Omega/\square$.

Figure 5C:
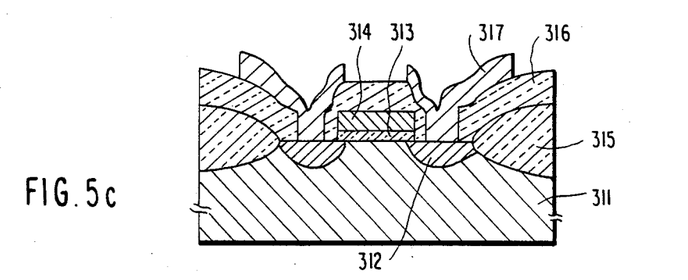

Next, as shown in FIG. 5(c), a silicon dioxide film 316 of 0.5 μm in thickness is formed by CVD using $SiH_4$ and $O_2$ as source gases at 400° C. in such a manner as to cover the silicon dioxide film 315 for device isolation and polycrystalline silicon 314 and then contact holes are formed in the CVD silicon dioxide film 316 by reactive ion etching using $CF_4$ and $O_2$ gases. Next, aluminum of 0.5 μm in thickness is deposited by DC sputtering and patterned to form 2 μm-wide aluminum wirings 317.

Figure 5D:
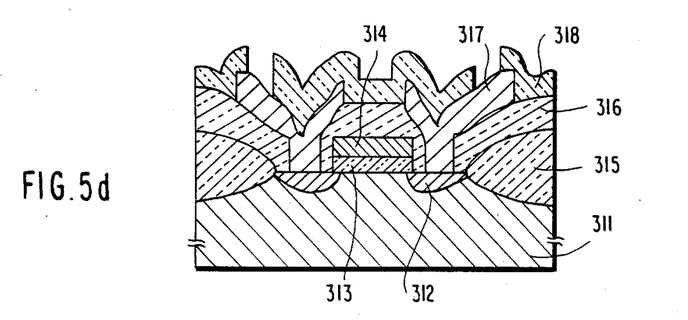

Next, as shown in FIG. 5(d), a monosilane gas ($SiH_4$), an ammonia gas ($NH_3$) and a nitrous oxide gas ($N_2O$) as source gases are caused to flow into a processing chamber of a parallel plate type plasma chemical vapor deposition having a discharge frequency of 380 KHz at the rates of 200 cc/min, 120 cc/min and 400 cc/min, respectively, and after the total gas pressure is set to 0.3 Torr, the discharge power is applied at a density of 0.5 W/cm$^2$, so that a silicon dioxide film 318 of 0.5 μm in thickness is formed in such a manner as to directly cover the aluminum wirings 317 at a substrate temperature of 300° C. Thereafter, part of the silicon oxynitride film 318 on the aluminum wirings 317 is removed selectively by reactive ion etching or the like, thereby providing the semiconductor device shown in FIG. 3.

Third Embodiment

Figure 6:
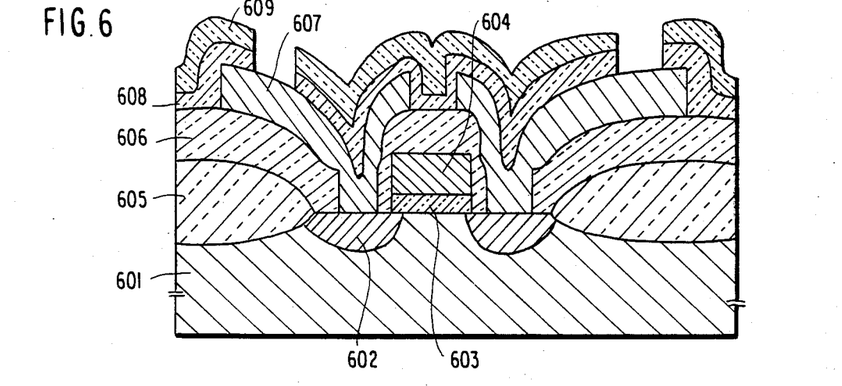
FIG. 6 is a sectional view of a semiconductor device according to a third embodiment of the present invention.

FIG. 6 is a sectional view of an N-channel silicon gate MOSFET having both the silicon oxynitride film of the present invention and phosphosilicate glass film as a final passivation film. In FIG. 6, reference numeral 601 is a P-type (100) Si substrate having specific resistance of 10 ohm-cm, 602 is an N-type source or drain, 603 is a gate silicon dioxide film of 400 Å in thickness, 604 is a gate electrode consisting of polycrystalline silicon and having a thickness of 4000 Å and a layer resistance of 20 $\Omega/\square$, 605 is a silicon dioxide film of 4000 Å in thickness for device isolation, 606 is a CVD-grown silicon dioxide film of 5000 Å in thickness, 607 is an aluminum wiring having a thickness of 5,000 Å and a line width of 2 μm, 608 is a phosphosilicate glass of 5,000 Å in thickness formed by CVD, and 609 is a silicon oxynitride film formed by plasma chemical vapor deposition method, having the atomic ratio of Si:N:O=48:30:22 and containing H of 7 atomic % to the whole composition.

In comparison with the semiconductor device of the second embodiment, the semiconductor device of the present embodiment having the construction described above includes phosphosilicate glass 608 under the silicon oxynitride film 609 so that the barrier property against the sodium ions (Na) of the final passivation film can be further enhanced and device reliability can be further improved. Phosphosilicate glass has low film stress as its fundamental characteristics. Therefore, even when it is used in combination with the silicon oxynitride film 609 as the final passivating insulator film, cracks are not generated, and even after heat-treatment for one hour in an $N_2$ 50%—$H_2$ 50% atmosphere, voids are not created in the aluminum wiring 607. Furthermore, moisture resistance of the semiconductor device having the phosphosilicate glass 608 and the silicon oxynitride film 609 as the passivating insulator film is equal to that of the semiconductor device of the second embodiment.

Next, a manufacturing method of the third embodiment of the present invention will be described.

FIGS. 7(a) to 7(d) are sectional views for explaining principal steps of manufacturing method for the semiconductor device according to the third embodiment of the present invention.

Figure 7A:
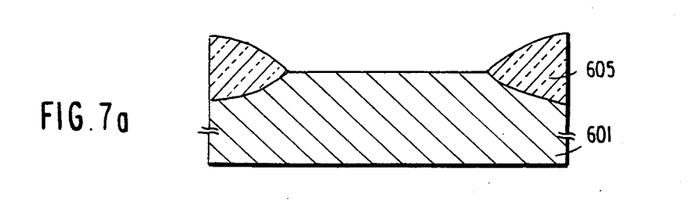
FIGS. 7(a) to 7(d) are sectional views showing principal steps for manufacturing the semiconductor device according to the third embodiment of the present invention.

First of all, a silicon oxide film 605 for device isolation is formed on a P-type Si substrate 601 by selective oxidation as shown in FIG. 7(a).

Figure 7B:
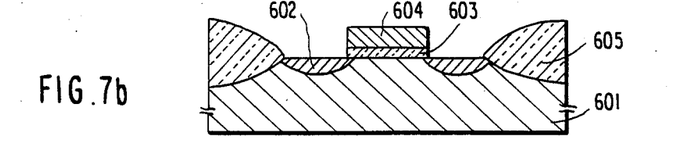

Next, as shown in FIG. 7(b), a gate silicon dioxide film 603 of 400 Å in thickness is formed in an active region where the silicon dioxide film 605 for device isolation is not formed, and a polycrystalline silicon of 4,000 Å in thickness is formed as a gate electrode on the gate silicon dioxide film 603 by CVD using $SiH_4$ as a source gas at 600° C. Phosphorus (P) is doped into this polycrystalline silicon 604 by thermal diffusion at 920° C. for one hour using $POCl_3$ and the resistance is set to 20 $\Omega/\square$, then the polycrystalline silicon 604 is patterned by reactive ion etching using a $CF_4$ gas to form the gate electrode. Next, As ions are implanted in a dose of $5 \times 10^{15}$ cm$^{-2}$ at 70 KeV into the P-type Si substrate 601 by self-alignment method using the gate electrode as the mask, thereby forming a source or drain 602. Heat-treatment is then effected at 900° C. for one hour to set the sheet resistance to 100 $\Omega/\square$.

Figure 7C:
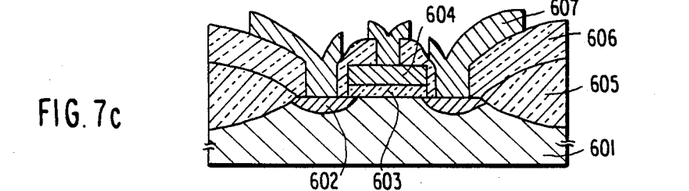

Next, as shown in FIG. 7(c), a silicon dioxide film 606 of 0.5 μm in thickness is formed by CVD using $SiH_4$ and $O_2$ as source gases at 400° C. in such a manner as to cover the silicon dioxide film 605 for device isolation and polycrystalline silicon 604 and thereafter contact holes are formed in the CVD silicon dioxide film 606 by reactive ion etching using $CF_4$ and $O_2$. Next, aluminum of 0.5 μm in thickness is deposited by DC sputtering and patterned to form 2 μm-wide aluminum wirings 607.

Figure 7D:
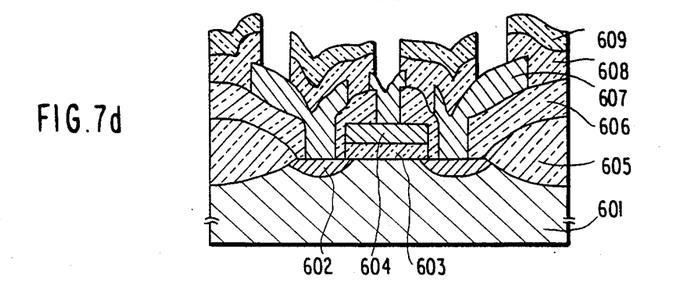

As shown in FIG. 7(d), phosphosilicate glass 608 of 0.5 μm in thickness is formed by CVD using $SiH_4$ and $O_2$ as the source gases at 400° C. in such a manner as to directly cover the aluminum wiring 607. Thereafter, monosilane gas ($SiH_4$), an ammonia gas ($NH_3$) and a nitrous oxide gas ($N_2O$) are caused to flow as source gases into a processing chamber of a parallel plate type plasma chemical vapor deposition having a discharge frequency of 380 KHz at the rates of 200 cc/min, 110 cc/min and 300 cc/min, respectively. After the total gas pressure is set to 0.3 Torr, discharge power is applied at a density of 0.5 W/cm² and a silicon oxynitride film 609 of 0.5 μm in thickness is formed on phosphosilicate glass 608 at a substrate temperature of 300° C. Thereafter, parts of the silicon oxynitride film 609 and phosphosilicate glass 608 on the aluminum wiring 607 are removed by reactive ion etching or the like, and the semiconductor device shown in FIG. 6 is obtained finally.

Fourth Embodiment

Figure 8:
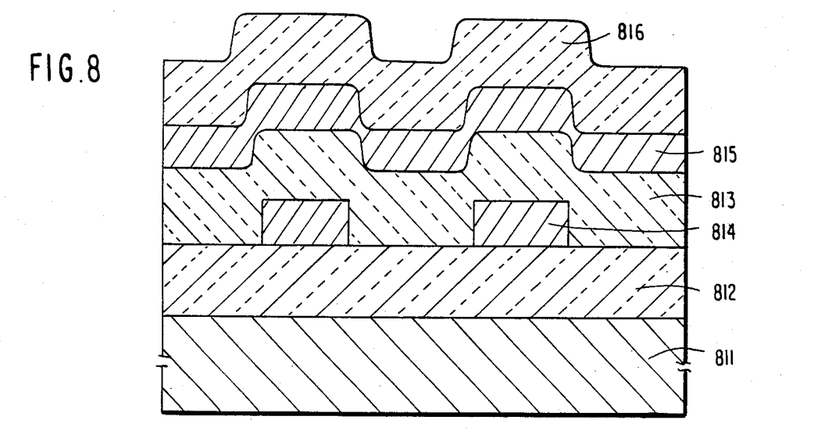
FIG. 8 is a sectional view of a semiconductor device according to a fourth embodiment of the present invention.

Next, a semiconductor device having a multi-layered metal wiring of the fourth embodiment of the present invention will be described with reference to FIG. 8. A first aluminum wiring 814 of 5,000 Å in thickness and having a line width of 2 μm is formed on a silicon dioxide film 812 of 1 μm in thickness which is formed on the surface of a P-type (100) silicon substrate 811 having a specific resistance 10 ohm-cm. Next, a silicon oxynitride film 813 of 5,000 Å in thickness having the atomic ratio of Si:N:O=45:33:22 and containing H of 11 atomic % to the whole composition is formed by plasma chemical vapor deposition in such a manner as to directly cover the aluminum wiring 814. A second aluminum wiring 815 of 5,000 Å in thickness and having a line width of 2 μm is formed on the silicon oxynitride film 813. A silicon oxynitride film 816 having the same composition as that of the silicon oxynitride film 813 is formed on the aluminum wiring 815.

In the semiconductor device having the multi-layered wiring structure as described above, voids are not generated in the first aluminum wiring 814 even after heat-treatment at 450° C. in a $N_2$ 50%—$H_2$ 50% atmosphere for one hour, and device reliability is high. When the pressure cooker test is carried out for 6,000 hours at 125° C., 2.3 atms and 100% RH, no cutting is observed in the aluminum wirings 814 and 815.

Next, a manufacturing method of the semiconductor device having the multi-layered wiring structure in the fourth embodiment of the present invention will be described with reference to FIGS. 9(a) to 9(d) which are sectional views of principal steps of manufacturing process.

Figure 9A:
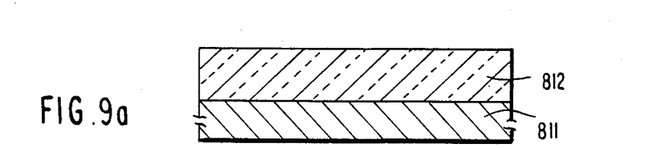
FIGS. 9(a) to 9(d) are sectional views showing principal steps for manufacturing the semiconductor device according to the fourth embodiment of the present invention.
Figure 9B:
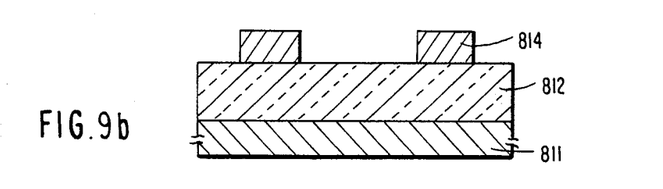
Figure 9C:
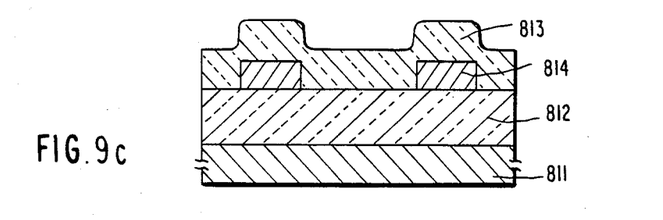
Figure 9D:
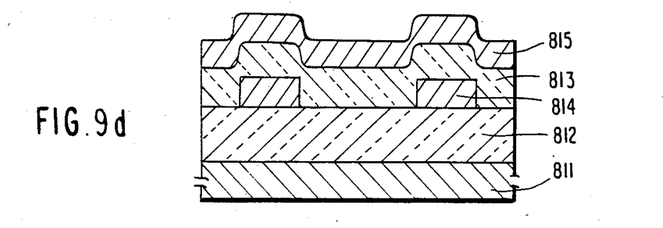

First of all, as shown in FIG. 9(a), a silicon dioxide film 812 of 1 μm in thickness is deposited on a silicon substrate 811 by chemical vapor deposition using $SiH_4$ and $O_2$ as source gases at 400° C., and an aluminum film of 0.5 μm in thickness is formed on the silicon dioxide film 812 by sputtering and patterned to form a first aluminum wiring 814 having a line width of 2 μm, as shown in FIG. 9(b). Next, monosilane gas ($SiH_4$), ammonia gas ($NH_3$) and nitrous gas ($N_2O$) gas as source gases are introduced into a processing chamber of a parallel plate type plasma chemical vapor deposition at the rates of 200 cc/min, 120 cc/min and 300 cc/min, respectively. After the total gas pressure is set to 0.3 Torrs, discharge power is applied at a density of 0.5 W/cm² in order to form a silicon oxynitride film 813 of 1 μm in thickness in such a manner as to directly cover the first aluminum wiring 814 as shown in FIG. 9(c) at a substrate temperature of 300° C. Thereafter, through-holes are formed in the silicon oxynitride film 813 by reactive ion etching using $CF_4$ and $O_2$ gases and an aluminum film of 0.5 μm in thickness is formed on the silicon oxynitride film 813 by sputtering as shown in FIG. 4(d) to form a second aluminum wiring 815 having a line width of 2 μm. Furthermore, when a silicon oxynitride film 816 is formed, the semiconductor device having a multi-layered wiring structure as shown in FIG. 8 can be obtained finally.

Fifth Embodiment

Figure 10:
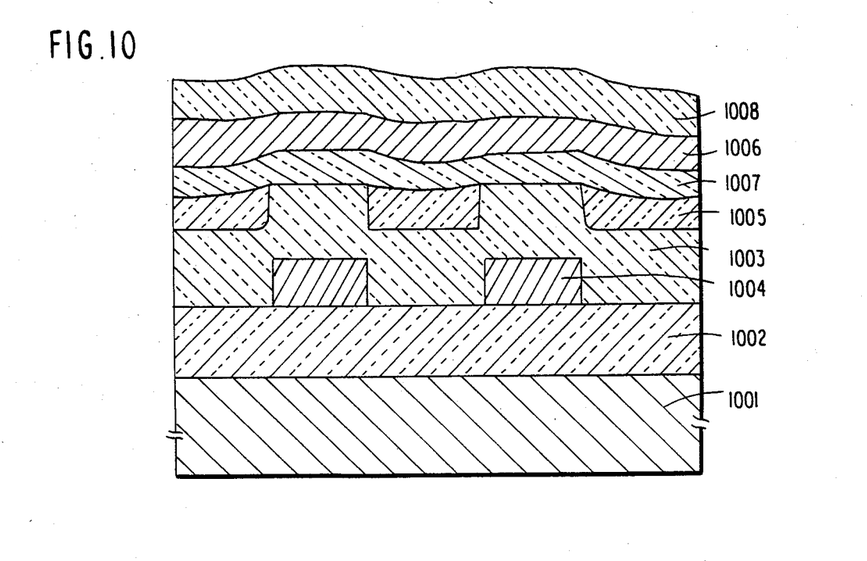
FIG. 10 is a sectional view of a semiconductor device according to a fifth embodiment of the present invention.

FIG. 10 is a sectional view showing a semiconductor device having a multi-layered metallic wirings in accordance with the fifth embodiment of the present invention. A first aluminum wiring 1004 having a thickness of 0.5 μm and a line width of 2 μm is formed on a silicon dioxide film 1002 of 1 μm in thickness formed on the surface of a P-type (100) silicon substrate 1001 having a specific resistance 10 ohm-cm. Next, a silicon oxynitide film 1003 of 0.5 μm in thickness having the atomic ratio of Si:N:O=45:33:22 and containing H of 11 atomic % to the whole composition is formed by plasma chemical vapor deposition in such a manner as to directly cover the aluminum wiring 1004. A silicon oxide film 1005 having a film stress of $5 \times 10^8$ dyne/cm² (compression) or below is formed on the silicon oxynitride film 1003 by coating, and a silicon oxynitride film 1007 having a thickness of 0.5 μm and the same composition as the silicon oxynitride film 1003 is formed on the silicon oxide film 1005 by plasma chemical vapor deposition. A second aluminum wiring 1006 having a thickness of 0.5 μm and a line width of 2 μm is formed on the silicon oxynitride film 1007. Another silicon oxynitride film 1008 having the same composition as the silicon oxynitride film 1003 is formed on the second aluminum wiring 1006.

Since the step portion is buried by the silicon oxide film 1005 in the semiconductor device having the multi-layered wiring structure described above, in comparison with the semiconductor device of the fourth embodiment, flatness of the inter-layer film is improved so that cutting of the second aluminum wiring 1007 and reduction of its thickness at the step portion can be prevented and device reliability can be improved. The stress of the inter-layer film consisting of the silicon oxynitride films 1003, 1007 and the silicon oxide film 1005 is equal to or lower than $5 \times 10^8$ dyne/cm², and no void is created in the first aluminum wiring 1004 even after the semiconductor device is heat-treated for one hour at 450° C. in an $N_2$ 50%—$H_2$ 50% atmosphere. When the pressure cooker test is carried out at 125° C., 2.3 atms and 100% RH for 6,000 hours, any cutting is not observed in the aluminum wirings 1004 and 1006.

Next, a manufacturing method of the semiconductor device having the multi-layered wiring structure in the fifth embodiment of the present invention will be explained with reference to FIGS. 11(a) to 11(f) which are sectional views of principal steps of manufacturing process.

Figure 11A:
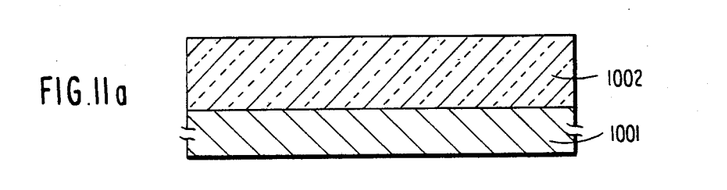
FIGS. 11(a) to 11(f) are sectional views showing principal steps for manufacturing the semiconductor device according to the fifth embodiment of the present invention.
Figure 11B:
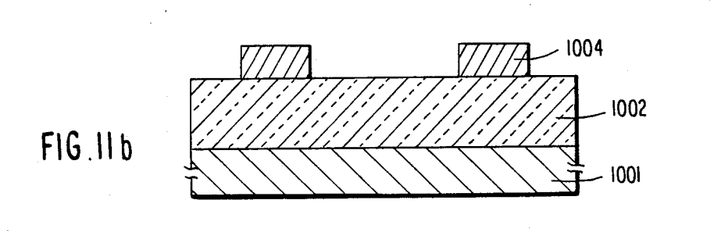
Figure 11C:
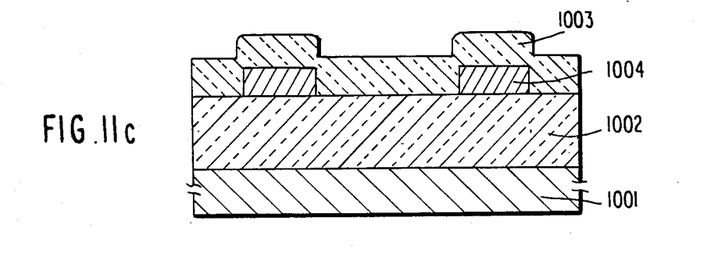
Figure 11D:
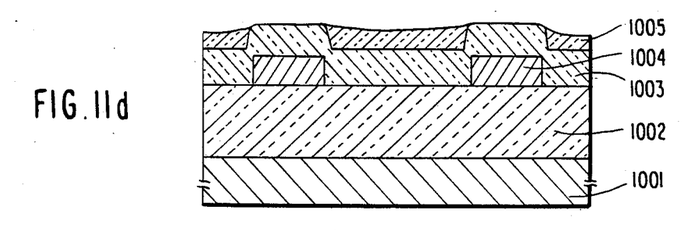
Figure 11E:
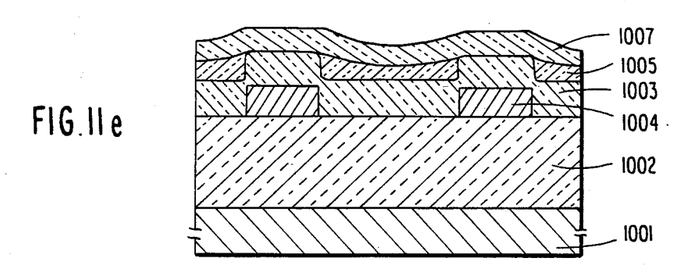
Figure 11F:
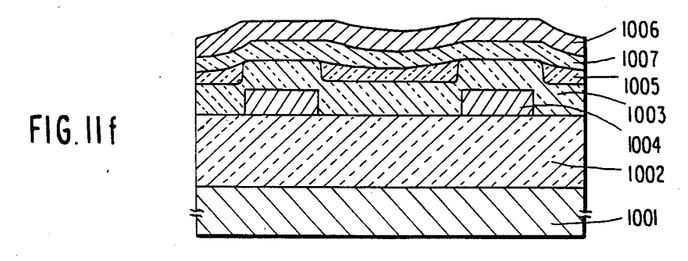

First of all, a silicon dioxide film 1002 of 1 μm in thickness is deposited on a silicon substrate 1001 by chemical vapor deposition as shown in FIG. 11(a) and an aluminum film of 0.5 μm in thickness is formed by DC sputtering on the silicon dioxide film 1002 and patterned to form a first aluminum wiring 1004 having a line width of 2 μm as shown in FIG. 11(b). Next, as shown in FIG. 11(c), a silicon oxynitride film 1003 of 0.5 m in thickness is deposited under the same condition and by the same method as those of the fourth embodiment. Then after an organic silica film is formed by coating, annealing is carried out for 30 minutes at 300° C. in a $N_2$ atmosphere to evaporate the organic component of the organic silica film and to form a silicon oxide film 1005 as shown in FIG. 11(d). Immediately thereafter, a silicon oxynitride film 1007 having the same composition as the silicon oxynitride 1003 is deposited in a film thickness of 0.5 m as shown in FIG. 11(e). Through-holes are formed in the inter-layer film consisting of the silicon oxynitride film 1007 and the silicon oxide film 1005 by reactive ion etching using $CF_4$ and $O_2$ gases, and then an aluminum film of 0.5 μm in thickness is formed on this inter-layer film by DC sputtering to form a second aluminum wiring 306 having a line width of 2 μm. There is thus obtained the semiconductor device having the multi-layered structure shown in FIG. 10.

What is claimed is:

1. A semiconductor device comprising: a semiconductor substrate having a plurality of circuit regions therein, an insulating film covering the surface of said semiconductor substrate, an aluminum wiring layer having a width of 2 μm or less, said aluminum wiring layer being formed on said insulating film, and a silicon oxynitride film covering said metal wiring layer, said silicon oxynitride film containing silicon oxynitride material consisting essentially of silicon oxynitride represented by the formula $Si_xN_yO_z$ and hydrogen, wherein x, y and z represent a set of atomic ratios and $x+y+z=1.00$, said set of atomic ratios falling within the area A-B-C-D-E-F-G-H of FIG. 2 of the drawings or on the lines connecting the vertices of said area and said sets of atomic ratios of the vertices of said area being as follows:

A (x=0.51, y=0.28, z=0.21)

B (x=0.47, y=0.28, z=0.25)

C (x=0.44, y=0.31, z=0.25)

D (x=0.41, y=0.36, z=0.23)

E (x=0.41, y=0.39, z=0.20)

F (x=0.44, y=0.38, z=0.18)

G (x=0.46, y=0.37, z=0.17)

H (x=0.51, y=0.32, z=0.17), and a content of hydrogen is 5 to 18 atomic percent of said $Si_xN_yO_z$.

* * * * *